(12) United States Patent
Hoff et al.

(10) Patent No.: US 7,168,055 B2
(45) Date of Patent: Jan. 23, 2007

(54) METHOD AND APPARATUS FOR DETECTING NETS PHYSICALLY CHANGED AND ELECTRICALLY AFFECTED BY DESIGN ECO

(75) Inventors: Jason Hoff, Fort Collins, CO (US); Daniel Prevedel, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 217 days.

(21) Appl. No.: 10/914,921

(22) Filed: Aug. 10, 2004

(65) Prior Publication Data

US 2006/0036982 A1   Feb. 16, 2006

(51) Int. Cl.
*G06F 17/50*   (2006.01)

(52) U.S. Cl. ............................................. 716/4; 716/5

(58) Field of Classification Search .................... 716/1, 716/4–6
See application file for complete search history.

(56) References Cited

U.S. PATENT DOCUMENTS

| | | | |
|---|---|---|---|
| 6,360,350 B1* | 3/2002 | Gabele et al. ................. | 716/1 |
| 6,463,574 B1* | 10/2002 | Culetu et al. .................. | 716/8 |
| 6,530,073 B1* | 3/2003 | Morgan ........................ | 716/18 |
| 6,601,222 B1* | 7/2003 | Mehrotra et al. .............. | 716/5 |
| 6,631,510 B1* | 10/2003 | Betz et al. .................... | 716/16 |

* cited by examiner

*Primary Examiner*—Thuan Do
*Assistant Examiner*—Binh Tat
(74) *Attorney, Agent, or Firm*—Suiter-Swantz PC LLO

(57) ABSTRACT

A method for detecting nets physically changed and electrically affected by a design ECO includes steps as follows. An ECO is executed on an IC design to produce a post-ECO IC design. A first group of nets of the IC design physically changed by the ECO is identified by comparing a pre-ECO database with a post-ECO database. A pre-ECO design SPEF file of the IC design is parsed with a script to identify a second group of nets in the pre-ECO database based on the first group of nets, the second group of nets being coupled to the first group of nets. The second group of nets is pre-ECO electrically affected nets. Parasitics for the first group of nets in the post-ECO database are extracted to generate a parasitic data file for the first group of nets. The parasitic data file is parsed with the script to identify a third group of nets in the post-ECO database based on the first group of nets, the third group of nets being coupled to the first group of nets. The third group of nets is post-ECO electrically affected nets. Finally, a file listing the first group of nets, the second group of nets and the third group of nets is generated.

20 Claims, 2 Drawing Sheets

METHOD AND APPARATUS FOR DETECTING NETS PHYSICALLY CHANGED AND ELECTRICALLY AFFECTED BY DESIGN ECO

FIELD OF THE INVENTION

The present invention generally relates to integrated circuits, particularly to a method and apparatus for detecting nets physically changed and electrically affected by a design ECO.

BACKGROUND OF THE INVENTION

In large ASIC (Application Specific Integrated Circuit) and Gate Array designs, an ECO (Engineering Change Order) is often performed to make small modifications to an already completed (or almost completed) IC design. A net is a set of two or more pins which must be connected, thus connecting the logic circuits having the pins. Currently, there exists no method for detecting nets that have been physically changed or electrically affected by an ECO. However, such information may be important in reducing the runtime of CAD (Computer Aided Design) tools needed to re-analyze the post ECO design and in evaluating the efficacy of the method used to execute the ECO.

Thus, it would be desirable to provide a method and apparatus for determining the change (both physical and electrical) on the design wiring caused by an ECO.

SUMMARY OF THE INVENTION

In an exemplary aspect of the present invention, a method for detecting nets physically changed and electrically affected by a design ECO includes steps as follows. An ECO is executed on an IC design to produce a post-ECO IC design. A first group of nets of the IC design physically changed by the ECO is identified by comparing a pre-ECO database with a post-ECO database. A pre-ECO design SPEF (Standard Parasitic Exchange Format) file of the IC design is parsed with a script to identify a second group of nets in the pre-ECO database based on the first group of nets, the second group of nets being coupled to the first group of nets. The second group of nets is pre-ECO electrically affected nets. Parasitics for the first group of nets in the post-ECO database are extracted to generate a parasitic data file for the first group of nets. The parasitic data file is parsed with the script to identify a third group of nets in the post-ECO database based on the first group of nets, the third group of nets being coupled to the first group of nets. The third group of nets is post-ECO electrically affected nets. Finally, a file listing the first group of nets, the second group of nets and the third group of nets is generated.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

The present provides a method and apparatus for detecting nets in an IC design which have been either physically changed or electrically affected by a design ECO. In a preferred embodiment, the present invention utilizes custom software to detect physically changed nets and industry standard parasitic extraction software to detect electrically affected nets.

Figure 1:
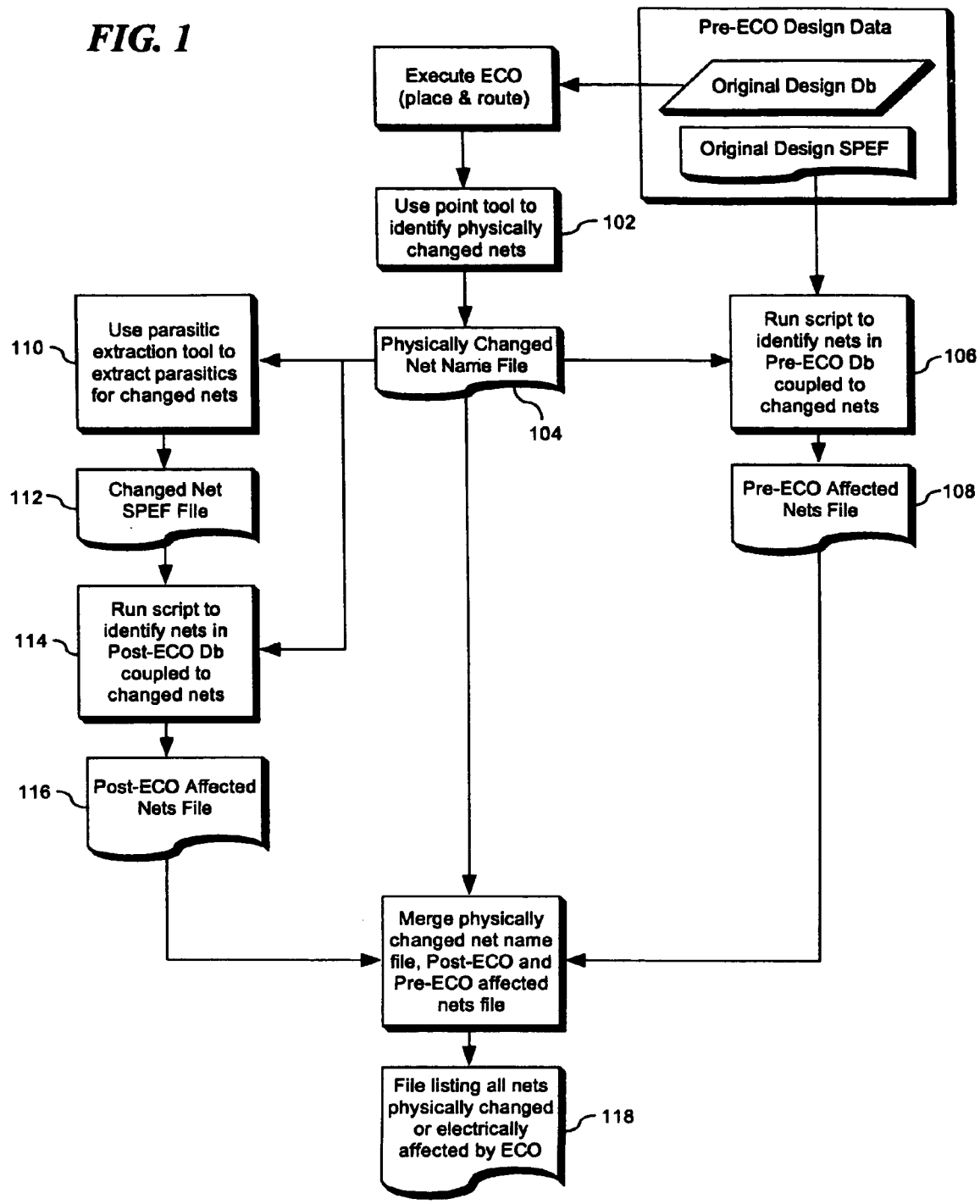
FIG. 1 is a simplified schematic diagram depicting a method for detecting nets physically changed and electrically affected by a design ECO in accordance with an exemplary embodiment of the present invention.

FIG. 1 is a simplified schematic diagram depicting a method for detecting nets physically changed and electrically affected by a design ECO in accordance with an exemplary embodiment of the present invention. As shown, a point tool (e.g., LSI Logic's "lsiDelta", or the like) is used to detect all nets in an IC design which have been physically changed by an ECO in step 102. It is understood that a point tool is a small computer program designed for a specific purpose only. The step 102 may be accomplished by comparing a pre-ECO database and post-ECO database and writing the differences to a log file. In a preferred embodiment, this point tool is written in C language using an industry CAD database API (Application Programming Interface) such as Milkyway C-API. Alternatively, this point tool implementation may be ported to any programming language and any CAD database and API. Thus, a physically changed net name file 104 which contains the names of the physically changed nets may be obtained.

Once the names of the physically changed nets are known, in step 106 a script (e.g., a script written in Perl, or the like) may be used to parse a cross coupled pre-ECO design SPEF (Standard Parasitic Exchange Format) file to generate a list of all nets which are coupled to the physically changed nets (these are nets that may potentially see a change in total capacitive loading after the ECO), shown as the pre-ECO affected nets file 108. The SPEF provides a standard medium to pass parasitic information between EDA (Electronic Design Automation) tools during any stage in the design process.

Then, in step 110 a parasitic extraction tool is run in incremental mode to extract the parasitics of only the changed nets in the post ECO database to generate a changed net SPEF file 112. Parasitic extraction is the process of creating an electrical model representation of the physical interconnections present between devices in an integrated circuit. From a technical viewpoint, the physical interconnect (especially for 0.35 um processes and below) does not behave as a virtual or ideal wire. Instead, it acts similarly to a network of capacitances and resistors, which may dominate circuit behavior, particularly with regard to timing. These interconnect parasitics become increasingly prevalent as process geometries shrink below 0.35 um or Deep Sub-Micron (DSM). In one embodiment, Star-RCXT may be used as the parasitic extraction engine to generate SPEF format data files. However, it is understood that any ASIC parasitic extraction tool and any parasitic data file format may be used as an alternative to Star-RCXT and SPEF. In step 114, this partial post-ECO SPEF is then parsed with the same script to generate a list of all nets which are coupled to the changed nets in the post-ECO database (these nets may also potentially see a change in total capacitive loading after the ECO), shown as the post-ECO affected nets file 116.

The end result of this method is a file 118 including a list of all nets in the design which have been physically changed by the ECO (i.e., the physically changed net name file 104) and two lists of nets which have not been physically changed but have been electrically changed in the sense that the total capacitive load represented by the net either increased or decreased or the coupled capacitive component of the net to a physically changed net has been significantly altered (i.e., the pre-ECO affected nets file 108 and the post-ECO affected nets file 116).

Figure 2:
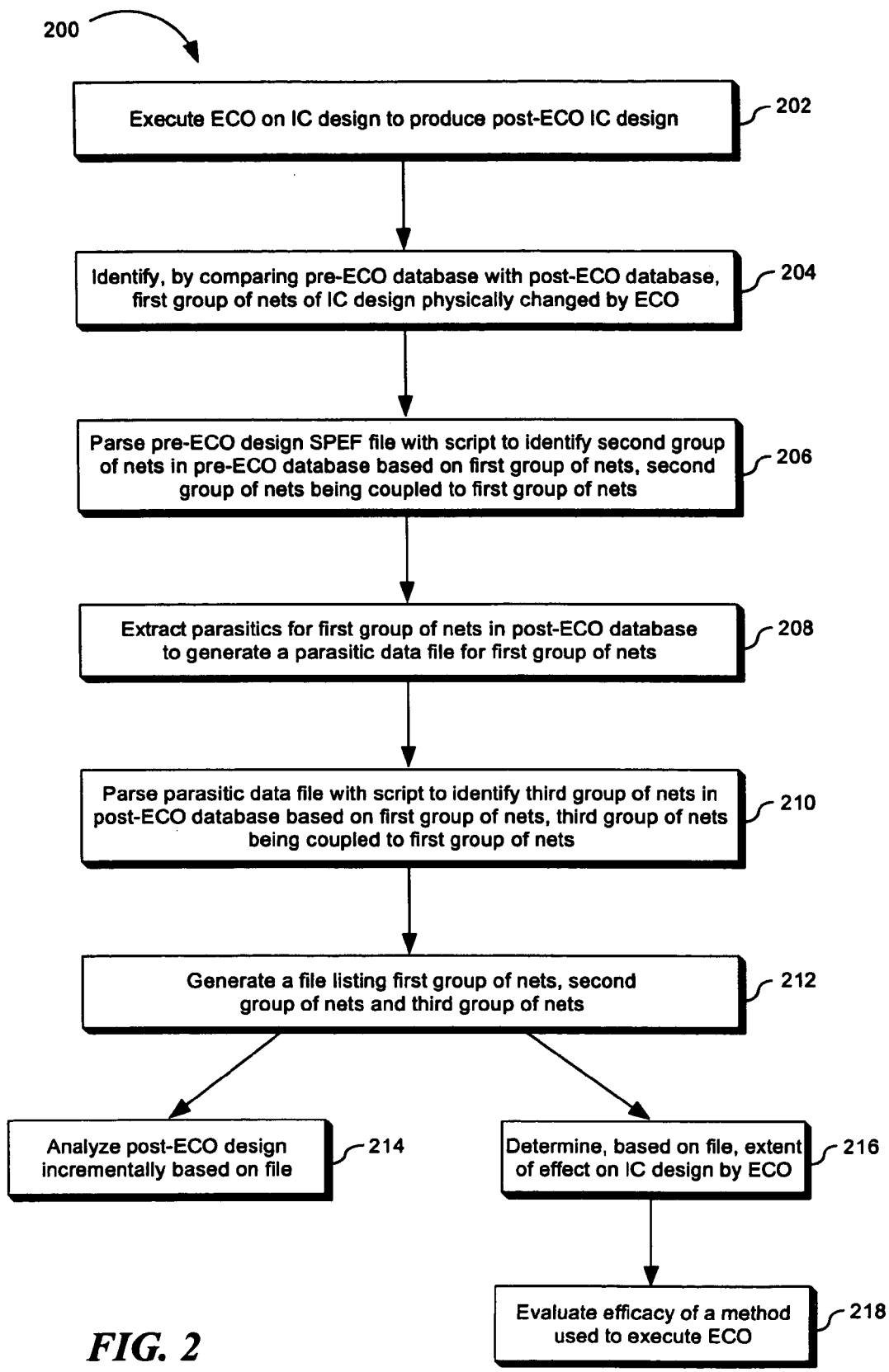
FIG. 2 is a flow diagram illustrating a method for detecting nets physically changed and electrically affected by a design ECO in accordance with another exemplary embodiment of the present invention.

FIG. 2 is a flow diagram illustrating a method 200 for detecting nets physically changed and electrically affected by a design ECO in accordance with another exemplary embodiment of the present invention. The method 200 may start with step 202 in which an ECO is executed on an IC design to produce a post-ECO IC design. A first group of nets of the IC design physically changed by the ECO is identified by comparing a pre-ECO database with a post-ECO database 204. The step 204 may be performed by executing a point tool written in C language using an industry CAD database API. However, this point tool implementation may be ported to any programming language and any CAD database and API without departing from the scope and spirit of the present invention.

A pre-ECO design SPEF file of the IC design is parsed with a script to identify a second group of nets in the pre-ECO database based on the first group of nets, the second group of nets being coupled to the first group of nets 206. The script may be written in Perl. However, this script implementation may be ported to any programming language without departing from the scope and spirit of the present invention. The second group of nets is pre-ECO electrically affected nets.

Parasitics for the first group of nets in the post-ECO database are extracted to generate a parasitic data file (preferably in SPEF format) for the first group of nets 208. For example, Star-RCXT may be used as the parasitic extraction engine to generate a SPEF format data file. However, it is understood that any ASIC parasitic extraction tool and any parasitic data file format may be used as an alternative to Star-RCXT and SPEF without departing from the scope and spirit of the present invention. The parasitic data file is parsed with the script to identify a third group of nets in the post-ECO database based on the first group of nets, the third group of nets being coupled to the first group of nets 210. The third group of nets is post-ECO electrically affected nets. A file listing the first group of nets, the second group of nets and the third group of nets is generated 212. Thus, the file includes all nets physically changed or electrically changed by the ECO. In a preferred embodiment, the step 212 includes the following sub-steps: (a) generating a changed net name file listing names of the first group of nets; (b) generating a pre-ECO affected nets file listing names of the second group of nets; (c) generating a post-ECO affected nets file listing names of the third group of nets; and (d) merging the changed net name file, the pre-ECO affected nets file, and the post-ECO affected nets file into a file listing the first group of nets, the second group of nets and the third group of nets.

In step 214, based on the file, the post-ECO IC design may be analyzed incrementally, i.e., only the portions of the design which actually changed or affected by the changes need to be re-extracted for parasitics and re-analyzed for timing, signal integrity, and physical design rule compliance. This may greatly reduce the runtime of CAD tools needed to re-analyze the post-ECO design.

Based on the file, an extent of the effect the ECO has had on the state of the design is determined 216. Based on the extent determined on step 216, in step 218 the efficacy of the method used to execute the ECO is valuated (i.e. was the implementation of the ECO truly incremental or did it affect large areas of the design which were unrelated to the actual ECO changes?).

It is to be noted that the above described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of software package. Such a software package may be a computer program product which employs a computer-readable medium including stored computer code which is used to program a computer to perform the disclosed function and process of the present invention. The computer-readable medium may include, but is not limited to, any type of conventional floppy disks, optical disks, CD-ROMS, magneto-optical disks, ROMs, RAMs, EPROMs, EEPROMs, magnetic or optical cards, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for detecting nets physically changed and electrically affected by a design ECO, comprising steps of:

executing an ECO on an IC design to produce a post-ECO IC design;

identifying, by comparing a pre-ECO database with a post-ECO database, a first group of nets of said IC design physically changed by said ECO;

parsing a pre-ECO design SPEF file of said IC design with a script to identify a second group of nets in said pre-ECO database based on said first group of nets, said second group of nets being coupled to said first group of nets;

extracting parasitics for said first group of nets in said post-ECO database to generate a parasitic data file for said first group of nets;

parsing said parasitic data file with said script to identify a third group of nets in said post-ECO database based on said first group of nets, said third group of nets being coupled to said first group of nets; and generating a file listing said first group of nets, said second group of nets and said third group of nets.

2. The method of claim 1, wherein said step of identifying a first group of nets is performed by executing a point tool.

3. The method of claim 1, wherein said script is written in Perl.

4. The method of claim 1, wherein said extracting step is performed using a parasitic extraction tool.

5. The method of claim 1, wherein said parasitic data file is in SPEF format.

6. The method of claim 1, wherein said step of generating a file listing said first group of nets, said second group of nets and said third group of nets comprises:

generating a changed net name file listing names of said first group of nets;

generating a pre-ECO affected nets file listing names of said second group of nets;

generating a post-ECO affected nets file listing names of said third group of nets; and merging said changed net name file, said pre-ECO affected nets file, and said post-ECO affected nets file into said file.

7. The method of claim 1, further comprising:
analyzing, based on said file, said post-ECO IC design incrementally.

8. The method of claim 1, further comprising:
determining, based on said file, an extent of effect on said IC design caused by said ECO; and
evaluating efficacy of a method used to execute said ECO.

9. An apparatus for detecting nets physically changed and electrically affected by a design ECO, comprising:

means for executing an ECO on an IC design to produce a post-ECO IC design;

means for identifying, by comparing a pre-ECO database with a post-ECO database, a first group of nets of said IC design physically changed by said ECO;

means for parsing a pre-ECO design SPEF file of said IC design with a script to identify a second group of nets in said pre-ECO database based on said first group of nets, said second group of nets being coupled to said first group of nets;

means for extracting parasitics for said first group of nets in said post-ECO database to generate a parasitic data file for said first group of nets;

means for parsing said parasitic data file with said script to identify a third group of nets in said post-ECO database based on said first group of nets, said third group of nets being coupled to said first group of nets; and means for generating a file listing said first group of nets, said second group of nets and said third group of nets.

10. The apparatus of claim 9, wherein said means for identifying a first group of nets comprises means for executing a point tool.

11. The apparatus of claim 9, wherein said script is written in Perl.

12. The apparatus of claim 9, wherein said means for extracting comprises means for using a parasitic extraction tool.

13. The apparatus of claim 9, wherein said parasitic data file is in SPEF format.

14. The apparatus of claim 9, wherein said means for generating a file listing said first group of nets, said second group of nets and said third group of nets comprises:

means for generating a changed net name file listing names of said first group of nets;

means for generating a pre-ECO affected nets file listing names of said second group of nets;

means for generating a post-ECO affected nets file listing names of said third group of nets; and means for merging said changed net name file, said pre-ECO affected nets file, and said post-ECO affected nets file into said file.

15. The apparatus of claim 9, further comprising:
means for analyzing, based on said file, said post-ECO IC design incrementally.

16. The apparatus of claim 9, further comprising:
means for determining, based on said file, an extent of effect on said IC design caused by said ECO; and
means for evaluating efficacy of a method used to execute said ECO.

17. A computer-readable medium having computer-executable instructions for performing a method for detecting nets physically changed and electrically affected by a design ECO, said method comprising steps of:

executing an ECO on an IC design to produce a post-ECO IC design;

identifying, by comparing a pre-ECO database with a post-ECO database, a first group of nets of said IC design physically changed by said ECO;

parsing a pre-ECO design SPEF file of said IC design with a script to identify a second group of nets in said pre-ECO database based on said first group of nets, said second group of nets being coupled to said first group of nets;

extracting parasitics for said first group of nets in said post-ECO database to generate a parasitic data file for said first group of nets;

parsing said parasitic data file with said script to identify a third group of nets in said post-ECO database based on said first group of nets, said third group of nets being coupled to said first group of nets; and generating a file listing said first group of nets, said second group of nets and said third group of nets.

18. The computer-readable medium of claim 17, wherein said step of generating a file listing said first group of nets, said second group of nets and said third group of nets comprises:

generating a changed net name file listing names of said first group of nets;

generating a pre-ECO affected nets file listing names of said second group of nets;

generating a post-ECO affected nets file listing names of said third group of nets; and merging said changed net name file, said pre-ECO affected nets file, and said post-ECO affected nets file into said file.

19. The computer-readable medium of claim 17, wherein said method further comprises analyzing, based on said file, said post-ECO IC design incrementally.

20. The computer-readable medium of claim 17, wherein said method further comprises:

determining, based on said file, an extent of effect on said IC design caused by said ECO; and evaluating efficacy of a method used to execute said ECO.

* * * * *